United States Patent [19]
Gilliam

[11] Patent Number: 5,790,463
[45] Date of Patent: Aug. 4, 1998

[54] ON-CHIP MOBILE ION CONTAMINATION TEST CIRCUIT

[75] Inventor: Gary R. Gilliam, Boise, Id.

[73] Assignee: Micron Technology, Inc., Boise, Id.

[21] Appl. No.: 814,778

[22] Filed: Mar. 10, 1997

Related U.S. Application Data

[63] Continuation of Ser. No. 455,833, May 31, 1995, Pat. No. 5,619,459.

[51] Int. Cl.$^6$ ............................................. G11C 29/00
[52] U.S. Cl. ................................... 365/201; 324/765
[58] Field of Search ........................... 365/201, 226, 365/189.09, 189.11; 324/765, 766, 767, 768, 769

[56] References Cited

U.S. PATENT DOCUMENTS

| | | |
|---|---|---|
| 5,079,744 | 1/1992 | Tobita et al. ........................ 365/201 |
| 5,119,337 | 6/1992 | Shimizu et al. ..................... 365/201 |
| 5,212,442 | 5/1993 | O'Toole et al. ..................... 365/201 |
| 5,276,646 | 1/1994 | Kim et al. ........................ 365/189.09 |

*Primary Examiner*—A. Zarabian
*Attorney, Agent, or Firm*—Seed and Berry LLP

[57] ABSTRACT

A circuit for testing for mobile ion contamination of a semiconductor chip has an enabling circuit, a voltage pump, and a regulating circuit. In a normal operating mode, the voltage pump is enabled whenever the substrate voltage drops below a normal operating voltage. In a test-mode, the voltage pump is continuously enabled to continually drive the substrate toward the normal operating voltage. However, the voltage regulating circuit is enabled to shunt current from the substrate to ground whenever the voltage pump drives the substrate beyond a test voltage that is intermediate the normal operating voltage and ground. The regulating circuit thus holds the substrate at the test voltage.

12 Claims, 2 Drawing Sheets

ON-CHIP MOBILE ION CONTAMINATION TEST CIRCUIT

CROSS-REFEREBCE TO RELATED APPLICATION

This application is a continuation of U. S. patent application Ser. No. 08/455,833, filed May 31, 1995, now U.S. Pat. No. 5,619,459.

TECHNICAL FIELD

This invention relates generally to electronic devices and more specifically to a mobile ion contamination testing circuit for use in the testing of an integrated circuit device such as a memory chip.

BACKGROUND OF THE INVENTION

For example, dynamic random access memory ("DRAM") chips, as well as other semiconductor circuits, have substrates that have often been biased with a negative voltage, such as −2 volts, during operation. However, ion contamination can prevent the circuit from working properly during normal operation when the substrate is biased at its normal operating voltage. More specifically, the source and drain regions of adjacent transistors are separated by a non-conductive field oxide. Due to wiring on the chip, this oxide is often overlaid with a conductive material. This effectively forms the gate of an unwanted transistor comprised of a source and drain from adjacent transistors, a gate from the overlying conductive material, and the field oxide as an insulating layer between the gate and a channel region. If the field oxide has ion contamination, the threshold of this spurious transistor becomes low enough that a conductive channel is created under the field oxide when the conductive material is activated. The problem of mobile ion contamination becomes more acute as transistors are placed in close proximity to each other on a chip.

The substrates of these high density integrated circuits are typically operated at a negative substrate voltage level. This effectively raises the threshold voltage at which these unwanted transistors begin to conduct. Therefore, the problem of mobile ion contamination is less likely to occur. In the past, testing of chips to uncover ion contamination problems has been accomplished by grounding the substrate because, if the circuit will work with a grounded substrate, it certainly will work with the substrate biased at the normal operating voltage. However, with increased component density, integrated circuits often will not function properly with a grounded substrate even when ion contamination is not present. As a result, there is no reliable, cost-effective technique for testing these high density integrated circuits for ion contamination.

SUMMARY OF THE INVENTION

In accordance with one aspect of the present invention, testing of integrated circuits for ion contamination problems is accomplished by an on-chip apparatus which regulates the substrate at two distinct levels. These levels are determined by an enabling mechanism. In a normal operating mode, the circuit regulates the voltage of the chip substrate at a constant operating level by a voltage pump which is activated whenever the substrate voltage drops below the operating voltage.

When a test-mode is enabled, the voltage pump operates constantly to drive the substrate voltage toward the operating voltage, but a regulating circuit with a transistor connected between the substrate and ground is enabled which shunts sufficient current to ground to hold the substrate at a different voltage level between ground and the operating voltage. This allows for testing of the chip for mobile ion contamination without the problems of the prior art.

DETAILED DESCRIPTION OF THE INVENTION

Figure 1:
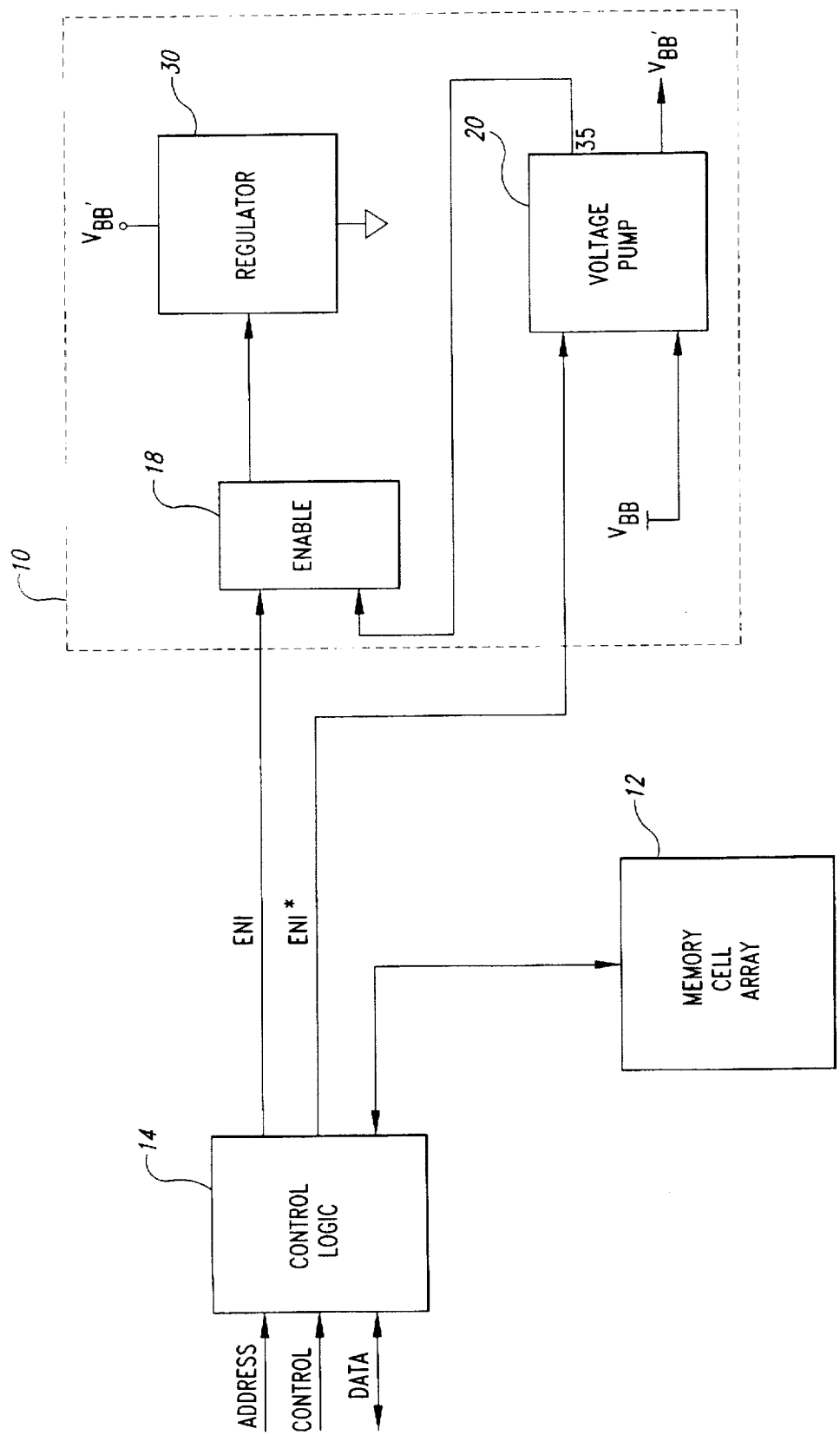
FIG. 1 is a block diagram of a preferred embodiment of the inventive test circuit in the environment of an integrated circuit memory device.

With reference to FIG. 1, a preferred embodiment of the inventive test circuit 10 is shown in the environment of a dynamic random access memory ("DRAM") semiconductor device having a memory cell array 12 and a control logic circuit 14 connected to the data address, and control bus of a device (not shown). The test circuit 10 is fabricated on the same substrate on which the integrated circuit is fabricated. The test circuit can be externally enabled to temporarily bias the substrate at a voltage between ground and the normal operating voltage.

The test circuit 10 includes an enabling circuit 18 that defines a normal-mode and a test-mode based on complimentary control signals EN1 and EN1* that are generated by the control logic circuit 14. The logic state of the control signals EN1 and EN1 * are controlled by the control logic circuit 14 decoding either the address bus or the data bus in a conventional manner. When in the normal operating mode, the control signal EN1 is a logic "0" and the control signal EN 1* is a logic "1".

The test circuit 10 also includes a voltage pump system 20 that drives the substrate voltage toward the normal operating voltage, and a regulator circuit 30 that holds the voltage of the substrate at a predetermined test voltage when the test circuit 10 is placed in a test-mode by EN1 going high and EN1* going low. In the normal operating mode, the voltage pump system 20 operates intermittently to bias the substrate of the chip at its normal operating voltage. In the test-mode, the voltage pump 20 runs continuously to drive the substrate toward the normal operating voltage. However, the regulator 30 conducts sufficient current to or from the substrate to maintain the substrate at the test voltage which is intermediate ground and the normal operating voltage.

Figure 2:
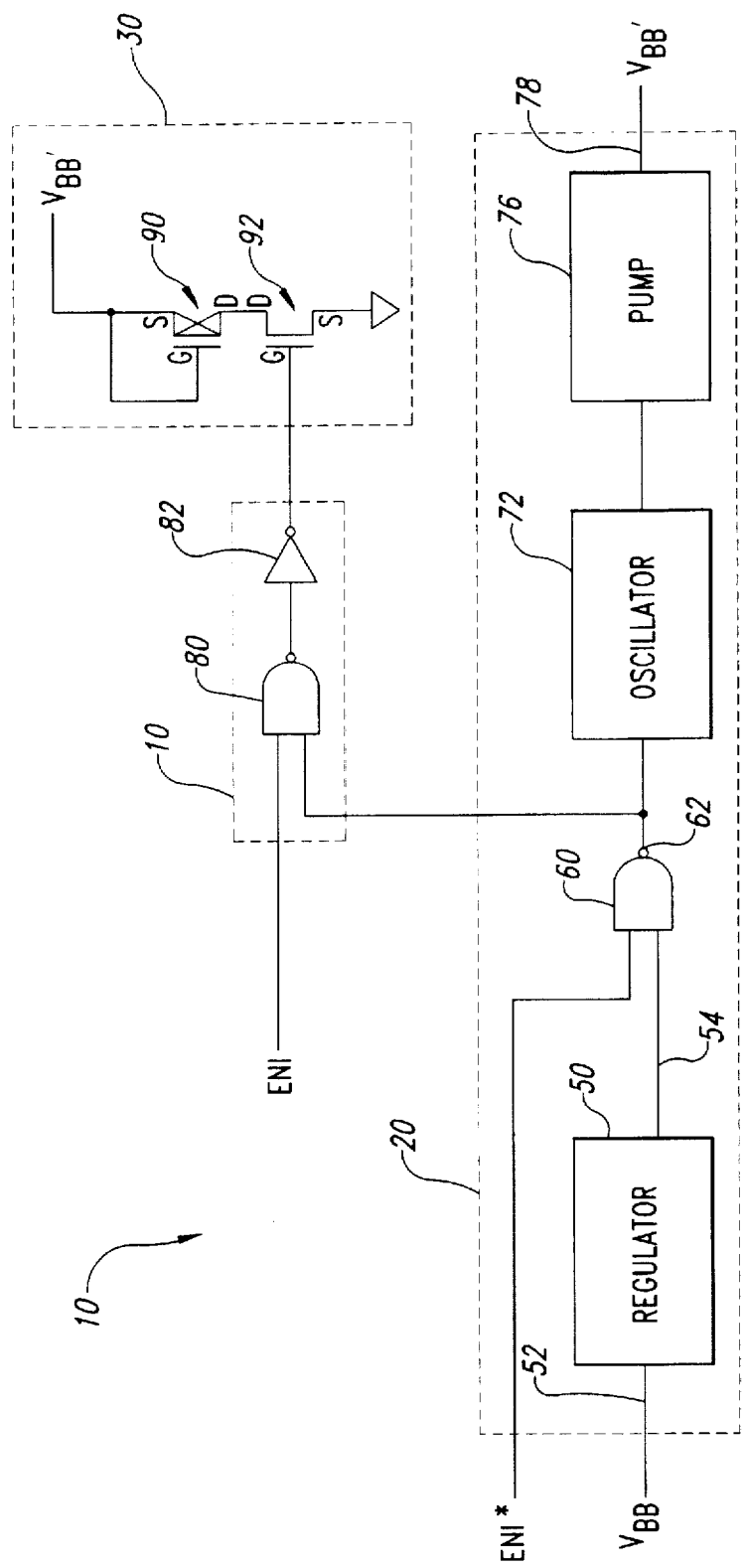
FIG. 2 is a logic diagram of the preferred embodiment of the voltage regulating apparatus.

One embodiment of the test circuit 10 is shown in greater detail in FIG. 2. The voltage pump system 20 includes a conventional regulator circuit 50 receiving a $V_{BB}$ signal on input line 52 that is connected to the substrate of the integrated circuit. The regulator circuit 50 has an output line 54 on which a logic "0" is generated whenever the absolute value of the $V_{BB}$ signal is smaller than a predetermined value, such as 2 volts. When the absolute value of the $V_{BB}$ signal is larger than a predetermined value, a logic "1" signal is generated on the output line 54. In the preferred embodiment, the substrate is biased to a voltage $V_{BB}$ of about −2 volts so that the output of the regulator circuit 50 is a logic "0" whenever $V_{BB}$ is between 0 and −2 volts and a logic "1" whenever $V_{BB}$ is more negative than about −2 volts.

The output line 54 is connected to one input of a NAND gate 60 that receives the EN1* signal at its other input. As mentioned above, the EN1* signal is a logic "1" during normal operation of the integrated circuit. Thus, during normal operation, an output 62 of the NAND gate 60 is a logic "0" when the absolute value of the $V_{BB}$ signal is smaller than the predetermined value and a logic "1" when the absolute value of the $V_{BB}$ signal is larger than the predetermined value.

The output 62 of the NAND gate 60 is connected to an enable input 70 of an oscillator 72 of conventional design. The oscillator 72 is enabled whenever it receives a logic "1" at the enable input 70. The oscillator 72 then outputs a series of pulses to a conventional voltage pump 76. As is well known in the art, the voltage pump 76 outputs or draws a current on its output line 78 whenever it receives pulses from the oscillator 72. The output line 78 is connected to the substrate of the integrated circuit. The voltage pump 76 thus drives the voltage of the substrate toward its normally operating voltage whenever the oscillator 72 is enabled and thus applies pulses to the voltage pump 76.

The following explanation of the operation of the voltage pump system 20 assumes that the normal operating voltage of the substrate is −2 volts, although other voltages, either positive or negative, could also be used. When power is initially applied to the integrated circuit, the substrate is a 0 volts. Thus, $V_{BB}$ is initially 0 volts, thereby causing the regulator circuit 50 to output a logic "0" to the NAND gate 60. Since the test circuit 10 is in the normal operation mode, the NAND gate 60 is enabled by the logic "1" EN1 *. The logic "0" at the output of the regulator circuit 50 thus causes the NAND gate 60 to output a logic "1" to the oscillator 72, thereby causing the oscillator 72 to apply pulses to the voltage pump 76. The voltage pump then draws current from the substrate, causing $V_{BB}$ to fall toward −2 volts. When $V_{BB}$ reaches −2 volts, the output line 54 of the regulator circuit 50 transitions from logic "0" to logic "1" thereby causing the output 62 of the NAND gate 60 to go low. The oscillator 70 is then disabled so that it no longer applies pulses to the voltage pump 76. The voltage pump 76 then stops drawing current from the substrate so that the voltage $V_{BB}$ does not fall significantly below −2 volts. The voltage pump 76 continues to operate intermittently in this manner to keep the substrate voltage at about −2 volts.

When the test mode is selected, EN1* goes low and EN1 goes high. The low EN1* causes NAND gate 60 to continuously output a logic "1" thereby causing the voltage pump 76 to continuously draw current from the substrate regardless of the output from the regulator circuit 50. Under these circumstances, $V_{BB}$ would continue to become more negative after reaching −2 volts. However, as explained above, with reference to FIG. 1, the logic "1" EN1 signal is applied to the enable circuit 18 to cause the regulator 30 to keep $V_{BB}$ from becoming more negative than −2 volts.

The enable circuit 18 includes a NAND gate 80 followed by an inverter 82 which together function as an AND gate. One input of the NAND gate 80 receives the EN1 signal while the other input is connected to the output 62 of the NAND gate 60. As explained above, in the test-mode, the output 62 of the NAND gate 60 is maintained at a logic "1" to continuously enable the oscillator 70. Also, the EN1 control signal is high in the test-mode. Thus, in the test-mode, the output of the inverter 82 will be high and the oscillator 72 will be enabled any time the test mode is enabled. The logic "1" at the output of the inverter 82 drives the regulator 30 to maintain the voltage of the substrate at a voltage between ground and the normal operating voltage of the substrate, as explained above.

The regulator 30 includes a P channel transistor 90 connected in series with an N channel transistor 92 between the substrate and ground. The source, gate, and drain of each of the transistors 90, 92 is labeled "S", "G", and "D", respectively. The gate of the N channel transistor 92 receives the output of the inverter 82 so that the N channel transistor 92 conducts whenever the test circuit 10 is enabled. The source and gate of the P channel transistor 90 are connected to each other so that the transistor 90 acts as a diode that conducts at the trigger voltage of the transistor 90. In the preferred embodiment, this trigger voltage is about 1 volt. Thus, when the N channel transistor 92 is enabled by the logic "1" from the inverter 82 during the test mode, current flows from ground to the substrate whenever the substrate becomes more negative than about −1 volt. As a result, all of the current from the voltage pump 76 is shunted to ground after the voltage on the substrate reaches −1 volt. In this manner, the regulator maintains the voltage of the substrate at a voltage between ground and the normal operating voltage of −2 volts during the test mode, and allows the voltage pump system 20 to operate in the normal manner when not in the test mode.

Variations of the preferred embodiment will be apparent to one skilled in the art. For example, the voltage pump 76 may either draw current from or provide current to the substrate to drive the substrate to respective negative or positive voltages. Also, the voltage maintained by the regulator 30 during the test mode and by the regulator circuit 50 during normal operation may be varied as desired. Other circuit topographies may also be used without departing from the spirit of the invention. For example, it is not absolutely necessary for the NAND gate 60 to be controlled by the EN1 * signal since the output of the regulator circuit 50 will always be at logic "0" in the test mode because the regulator 30 will prevent the substrate from ever reaching the normal operating voltage during the test mode.

While a specific embodiment of the invention has been described in this application for illustrative purposes, the claims are not limited to the embodiments described herein. Equivalent devices or steps may be substituted for those described, which operate according to principles of the present invention and thus fall within the scope of the claims made.

I claim:

1. A test circuit for an integrated circuit powered by a supply voltage, the integrated circuit being formed on the substrate of a semiconductor chip along with the test circuit to test the semiconductor chip for ion contamination, said test circuit comprising:
    a voltage regulator driving the substrate to a negative voltage; and
    a test circuit allowing said integrated circuit to be tested for mobile ion contamination, said test circuit being coupled to the voltage regulator to cause the voltage regulator to maintain the voltage level of the substrate at a test voltage that is intermediate the normal operating voltage and ground without substantially altering the magnitude of the supply voltage.

2. The semiconductor chip of claim 1 wherein the integrated circuit is a dynamic random access memory.

3. The semiconductor chip of claim 1 wherein the test circuit includes a selectively enabled voltage sensitive current shunt that allows current to flow between the substrate and ground whenever the absolute value of the voltage on the substrate reaches the test voltage, the voltage sensitive current shunt being enabled to allow the integrated circuit to be tested for mobile ion contamination.

4. The semiconductor chip of claim 1 wherein the test circuit includes a selectively enabled voltage sensitive current shunt comprising the series combination of first and second field effect transistors connected between the substrate and ground, the first transistor having its gate connected to its source to function as a diode, and the second transistor receiving a control signal that causes the second transistor to conduct when the shunt circuit is enabled whereby, when enabled, said voltage sensitive current shunt allows current to flow between the substrate and ground whenever the absolute value of the voltage on the substrate reaches the test voltage to allow the integrated circuit to be tested for mobile ion contamination.

5. In a semiconductor chip adapted to be powered by a supply voltage, the semiconductor chip having a substrate that is maintained at an operating voltage during normal operation, an on-chip voltage regulating apparatus for selectively altering the voltage of the substrate to facilitate testing for ion contamination of the semiconductor chip, the apparatus comprising:

an enabling circuit to define a normal-mode and a test-mode; and a power control circuit coupled to the enabling circuit to regulate the voltage of the substrate either at the operating voltage in the normal mode or at a test voltage intermediate the operating voltage and ground in the test mode, the power control circuit regulating the voltage of the substrate without substantially altering the magnitude of the supply voltage.

6. The voltage regulating apparatus of claim 5 wherein the power control circuit comprises:

a voltage pump system that operates to drive the substrate voltage toward the operating voltage; and a regulator circuit operating to hold the voltage of the substrate at the test voltage when the enabling circuit defines the test-mode.

7. The voltage regulating apparatus of claim 6 wherein the regulator circuit comprises a selectively enabled voltage sensitive current shunt that, when enabled, allows current to flow between the substrate and ground whenever the absolute value of the voltage on the substrate reaches the test voltage, the voltage sensitive current shunt being enabled to allow the integrated circuit to be tested for mobile ion contamination.

8. The voltage regulating apparatus of claim 5 wherein the power control circuit comprises:

a voltage pump system that operates to drive the substrate voltage toward the operating voltage;

a first field effect transistor having a gate, source, and drain, the gate and the source being connected to each other and to the substrate, the first field effect transistor having a trigger voltage that is substantially at the test voltage; and a second field effect transistor having a gate, source, and drain, the drain being connected to the drain of the first device, the source being connected to ground, and the gate being driven to cause the second field effect transistor to conduct when the enabling circuit defines a test-mode.

9. The voltage regulating apparatus of claim 6 wherein the voltage pump system comprises:

a regulator with an input and an output, the input being connected to the substrate and the output generating a binary signal indicative of when the substrate voltage is of lesser magnitude than the operating voltage;

an oscillator having an enable input connected to the output of the regulator, the oscillator generating a series of clock pulses at an output responsive to binary signal from the regulator; and a voltage pump having an input and an output, the input being connected to the output of the oscillator and the output being connected to the substrate, the voltage pump driving the substrate toward the operating voltage responsive to clock pulses from the oscillator.

10. The voltage regulating apparatus of claim 9 further including a second enable circuit for continuously applying the binary signal to the oscillator when the enabling circuit defines the test-mode so that the voltage pump continuously operates in the test-mode.

11. In an integrated circuit formed on a semiconductor chip having a substrate that is maintained at a normal operating voltage during normal operation, a method of testing the integrated circuit, comprising:

selectively maintaining the substrate at a test voltage that is intermediate the normal operating voltage and ground;

maintaining a supply voltage to the integrated circuit at a normal operating voltage; and testing the integrated circuit for mobile ion contamination.

12. The method of claim 11 wherein the substrate voltage is maintained at the test-mode by the steps of:

driving the substrate voltage toward the operating voltage; and shunting the substrate to ground when the substrate voltage is of greater magnitude than the test voltage when the chip is being test for ion contamination.

* * * * *